(12) United States Patent
Kirkpatrick

(10) Patent No.: US 11,448,274 B2
(45) Date of Patent: Sep. 20, 2022

(54) COMPOSITES AND METHODS OF FORMING COMPOSITES HAVING CERAMIC INSERTS

(71) Applicant: GOODRICH CORPORATION, Charlotte, NC (US)

(72) Inventor: Christopher T. Kirkpatrick, Pueblo West, CO (US)

(73) Assignee: Goodrich Corporation, Charlotte, NC (US)

( * ) Notice: Subject to any disclaimer, the term of this patent is extended or adjusted under 35 U.S.C. 154(b) by 257 days.

(21) Appl. No.: 16/779,873

(22) Filed: Feb. 3, 2020

(65) Prior Publication Data
US 2021/0239170 A1    Aug. 5, 2021

(51) Int. Cl.
| | | |
|---|---|---|
| F16D 65/12 | (2006.01) | |
| F16D 69/02 | (2006.01) | |
| C23C 16/26 | (2006.01) | |
| F16D 65/02 | (2006.01) | |

(52) U.S. Cl.
CPC ......... *F16D 65/126* (2013.01); *F16D 65/127* (2013.01); *F16D 69/023* (2013.01); *C23C 16/26* (2013.01); *F16D 2065/132* (2013.01); *F16D 2065/1324* (2013.01); *F16D 2200/0047* (2013.01); *F16D 2200/0052* (2013.01); *F16D 2250/0015* (2013.01); *F16D 2250/0023* (2013.01)

(58) Field of Classification Search
CPC .............................................. F16D 65/123–128
USPC .................................................... 188/218 XL
See application file for complete search history.

(56) References Cited

U.S. PATENT DOCUMENTS

| | | | |
|---|---|---|---|
| 5,613,578 A * | 3/1997 | Moseley | F16D 65/125 188/218 XL |
| 6,221,475 B1 | 4/2001 | Domergue et al. | |
| 8,210,232 B2 * | 7/2012 | Xia | B22D 19/00 164/98 |
| 9,255,618 B2 * | 2/2016 | Beer | F16D 65/847 |
| 2005/0183909 A1 * | 8/2005 | Rau, III | F16D 65/12 188/218 XL |
| 2006/0076200 A1 * | 4/2006 | Dessouki | F16D 65/125 188/218 XL |
| 2009/0260931 A1 * | 10/2009 | Ulicny | F16D 65/12 188/218 XL |
| 2010/0000070 A1 * | 1/2010 | La Forest | F16D 69/023 29/525.06 |
| 2012/0118685 A1 * | 5/2012 | Johnson | F16D 65/12 188/218 XL |
| 2012/0227624 A1 | 9/2012 | Loukus et al. | |

(Continued)

FOREIGN PATENT DOCUMENTS

| | | |
|---|---|---|
| EP | 3543222 | 9/2019 |
| GB | 2485673 | 5/2012 |
| WO | 2005121402 | 12/2005 |

OTHER PUBLICATIONS

European Patent Office, European Search Report dated Jul. 6, 2021 in Application No. 21154965.4.

*Primary Examiner* — Christopher P Schwartz
(74) *Attorney, Agent, or Firm* — Snell & Wilmer L.L.P.

(57) ABSTRACT

A brake disk may comprise a friction disk formed of at least one of a carbon fiber-ceramic matrix composite material or a carbon fiber-carbon matrix composite material. A first surface of the friction disk defines a first recess. A first ceramic insert comprising ceramic powder may be located in the first recess.

16 Claims, 7 Drawing Sheets

(56) References Cited

U.S. PATENT DOCUMENTS

| | | | |
|---|---|---|---|
| 2015/0001017 A1* | 1/2015 | Kirkpatrick | B64C 25/44 |
| | | | 188/218 XL |
| 2016/0122252 A1 | 5/2016 | Garnier et al. | |
| 2017/0002458 A1 | 1/2017 | Le Costaouec et al. | |
| 2017/0102043 A1 | 4/2017 | Opalka et al. | |
| 2017/0184164 A1* | 6/2017 | Bean | F16D 65/128 |
| 2018/0044537 A1 | 2/2018 | Poteet et al. | |
| 2019/0011004 A1* | 1/2019 | Mettrick | B60R 13/005 |
| 2021/0156440 A1* | 5/2021 | Pajak | B64C 25/42 |
| 2021/0239171 A1* | 8/2021 | Kirkpatrick | F16D 65/126 |

* cited by examiner

COMPOSITES AND METHODS OF FORMING COMPOSITES HAVING CERAMIC INSERTS

FIELD

The present disclosure relates to composites, and more specifically, to composites having ceramic inserts and methods of forming the same.

BACKGROUND

Aircraft typically utilize brake systems on wheels to slow or stop the aircraft during landings, taxiing and rejected takeoffs. Aircraft brake systems generally employ a brake stack (also referred to as a heat sink) comprising a series of friction disks that may be forced into sliding contact with one another during brake actuation to slow or stop the aircraft. The heat sink typically comprises rotor disks and stator disks that, in response to axial compressive pressure, convert the kinetic energy of the aircraft into heat through frictional forces experienced between the friction disks. Heat sinks comprising combinations of carbon fibers and ceramic matrix composite (CMC) materials may prove advantageous in addressing frictional and wear performance.

Next generation heat sinks are expected to exhibit greater heat capacities in order to absorb and dissipate greater amounts of heat, particularly during rejected takeoffs. However, making a reusable CMC core that has the needed strength, the needed specific heat (Cp) has proven difficult. Boron or boron carbide materials possess relatively high heat capacities and thermal stability. Difficulties arise, however, when attempting to incorporate boron or boron carbide materials into carbon fiber structures, such as brake preforms, resulting in limitations on the size and amounts of the high heat capacity materials that may be incorporated into the carbon fiber structures. Further, solid disks of boron carbide are expensive and are susceptible to fracture.

SUMMARY

A brake disk is disclosed herein. In accordance with various embodiments, the brake disk may comprise a first friction disk formed of at least one of a carbon fiber-ceramic matrix composite material or a carbon fiber-carbon matrix composite material. A first surface of the first friction disk may define a first recess. The first surface may extend from an inner diameter to an outer diameter of the first friction disk. A first ceramic insert comprising ceramic powder may be located in the first recess.

In various embodiments, the ceramic powder may comprise boron carbide. In various embodiments, the first ceramic insert may further comprise chopped fibers.

In various embodiments, a second friction disk may be coupled to the first friction disk.

The second friction disk may be formed of the at least one of the carbon fiber-ceramic matrix composite material or the carbon fiber-carbon matrix composite material. A second surface of the second friction disk may define a second recess, the second surface of the second friction disk being oriented toward the first surface of the first friction disk. A second ceramic insert may be located in the second recess.

In various embodiments, a wear surface of the first friction disk may be oriented away from the second friction disk. The wear surface of the first friction disk is axially opposite the first surface of the first friction disk.

In various embodiments, a second ceramic insert may be located in a second recess of the first friction disk. The second recess may be defined by a second surface of the first friction disk, the second surface being oriented away from the first surface.

In various embodiments, the first friction disk may comprise at least one of a rotor core or a stator core. In various embodiments, a wear liner may be coupled to the first friction disk.

A method of making a friction disk is also disclosed herein. In accordance with various embodiments, the method may comprise densifying a fibrous preform to form a densified fibrous preform, forming a plurality of first recesses in a first surface of the densified fibrous preform; depositing ceramic powder in the plurality of first recesses, and depositing carbon around the ceramic powder in the plurality of first recesses using chemical vapor infiltration.

In various embodiments, the method may further comprise performing a silicon melt infiltration. In various embodiments, the method may further comprise forming a plurality of second recesses in a second surface of the densified fibrous preform, and depositing ceramic powder in the plurality of second recesses.

In various embodiments, the densified fibrous preform may comprise carbon fiber-carbon matrix composite material. In various embodiments, the ceramic powder in the plurality of first recesses may comprise boron carbide.

In various embodiments, the method may further comprise depositing chopped fibers in the plurality of first recesses.

A method of making a brake disk is also disclosed herein. In accordance with various embodiments, the method may comprise forming a first friction disk by: forming a plurality of first recesses in a first surface of a first fibrous preform, depositing ceramic powder in the plurality of first recesses, and depositing carbon around the ceramic powder in the plurality of first recesses using chemical vapor infiltration.

In various embodiments, the method may further comprise forming a second friction disk by: forming a plurality of second recesses in a non-wear surface of a second fibrous preform, depositing ceramic powder in the plurality of second recesses, and depositing carbon around the ceramic powder in the plurality of second recesses using chemical vapor infiltration; and coupling the second friction disk to the first friction disk with the non-wear surface of the second friction disk oriented toward the first surface of the first friction disk.

In various embodiments, the method may further comprise coupling a first wear liner over the first surface of the first friction disk. In various embodiments, forming the first friction disk may further comprises: forming a plurality of second recesses in a second surface of the first fibrous preform, the second surface being axially opposite the first surface; depositing ceramic powder in the plurality of second recesses; and depositing carbon around the ceramic powder in the plurality of second recesses using chemical vapor infiltration.

In various embodiments, the method may further comprise depositing chopped fibers in the plurality of first recesses. In various embodiments, the method may further comprise densifying the first fibrous preform prior to forming the plurality of first recesses.

The foregoing features and elements may be combined in various combinations without exclusivity, unless expressly indicated herein otherwise. These features and elements as well as the operation of the disclosed embodiments will become more apparent in light of the following description and accompanying drawings.

Figure 1:
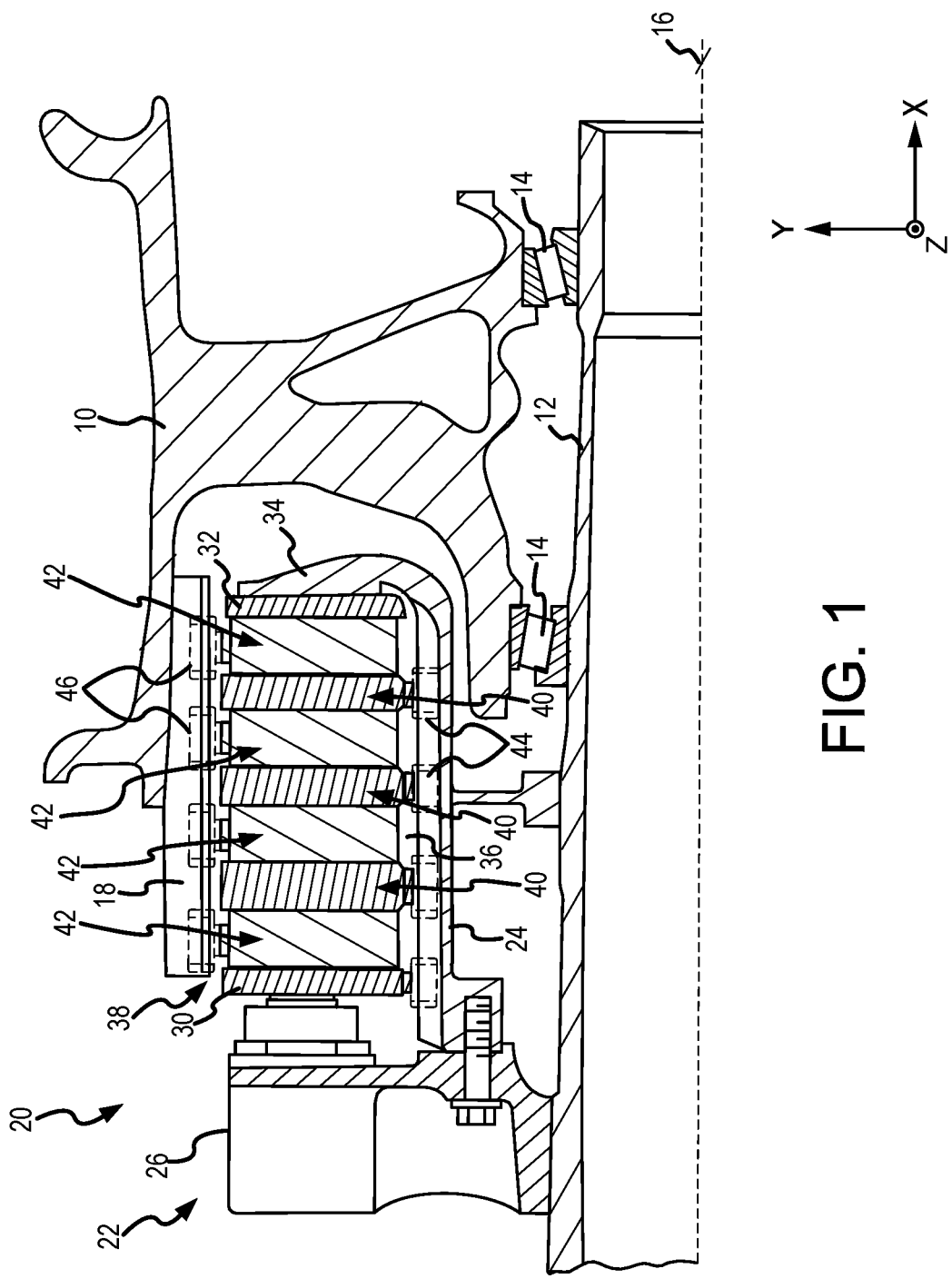
FIG. 1 illustrates a multi-disk brake assembly, in accordance with various embodiments.

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein without departing from the spirit and scope of the disclosure. Thus, the detailed description herein is presented for purposes of illustration only and not of limitation.

Provided herein, according to various embodiments, are fiber reinforced composite parts and method(s) for fabricating fiber reinforced composite parts, such as brake disks, having ceramic inserts. While numerous details are included herein pertaining to aircraft components, such as brake components, the components and method(s) disclosed herein can be applied to fabricate other carbon fiber-reinforced/carbon matrix (C/C) composite components that benefit from better wear performance.

With reference to FIG. 1, a multi-disk brake assembly 20 is illustrated, in accordance with various embodiments. Brake assembly 20 is mounted on an axle 12 for use with a wheel 10 disposed on and configured to rotate about the axle 12 via one or more bearing assemblies 14. A central axis 16 extends through the axle 12 and defines a center of rotation of the wheel 10. A torque plate barrel 24 (sometimes referred to as a torque tube or barrel or a torque plate) is aligned concentrically with the central axis 16. Wheel 10 is rotatable relative to the torque plate barrel 24. Torque plate barrel 24 includes a series of axially extending stator splines 36 (one shown). Wheel 10 includes a series of axially extending rotor splines 18 (one shown). Rotation of wheel 10 is modulated by brake assembly 20.

Brake assembly 20 includes a plurality of brake disks 38. The plurality of brake disks 38 includes at least one non-rotatable friction disk (stator disk) 40, and at least one rotatable friction disk (rotor disk) 42. Each of the brake disks 38 includes an attachment structure. In various embodiments, each of the stator disks 40 includes a plurality of stator lugs 44 at circumferentially spaced positions around an inner circumference of stator disks 40 as an attachment structure. Similarly, each of the rotatable rotor disks 42 includes a plurality of rotor lugs 46 at circumferentially spaced positions around an outer circumference of rotor disks 42.

Brake disks 38 may include an end plate 32 and a pressure plate 30 located on opposing axial ends of the brake disk stack. End plate 32 is connected to, or is otherwise frictionally engaged with, a reaction plate 34 of torque plate barrel 24. End plate 32 is non-rotatable by virtue of its connection to torque plate barrel 24. Stator splines 36 may support pressure plate 30 such that pressure plate 30 is also non-rotatable. Stator splines 36 may also support non-rotatable stator disks 40. Stator disks 40 may engage stator splines 36 with gaps formed between stator lugs 44. Similarly, rotor disks 42 may engage rotor splines 18 with gaps formed between rotor lugs 46. Rotor disks 42 may be rotatable by virtue of their engagement with rotor splines 18 of wheel 10.

An actuating mechanism for the brake assembly 20 includes a plurality of piston assemblies 22 (one shown) circumferentially spaced around a piston housing 26. Upon actuation, the plurality of piston assemblies affects a braking action by urging the pressure plate 30 and the plurality of stator disks 40 into frictional engagement with the plurality of rotor disks 42 and against the end plate 32. Through compression of the plurality of rotor disks 42 and the plurality of stator disks 40 between the pressure plate 30 and the end plate 32, the resulting frictional contact slows or stops or otherwise prevents rotation of the wheel 10.

In various embodiments, the plurality of rotor disks 42 and the plurality of stator disks 40 are fabricated from various materials, such as, for example, carbon fiber-ceramic matrix composite (C/CMC) material, that enable the brake disks to withstand and dissipate the heat generated during and following a braking action.

In various embodiments, the non-rotating frictional components of brake assembly 20 (i.e., pressure plate 30, end plate 32, and stator disks 40) may comprise a material that is different from the material of the rotating frictional component (e.g., rotor disks 42). For example, in various embodiments, rotor disks 42 comprise a carbon fiber-carbon matrix (C/C) composite material and pressure plate 30, end plate 32, and/or stator disks 40 comprise C/CMC composite material. In various embodiments, in the unworn state (i.e., prior to use) the axial thickness of the rotor disks 42 and/or of the stator disks 40 in brake assembly 20 may vary.

Figure 2:
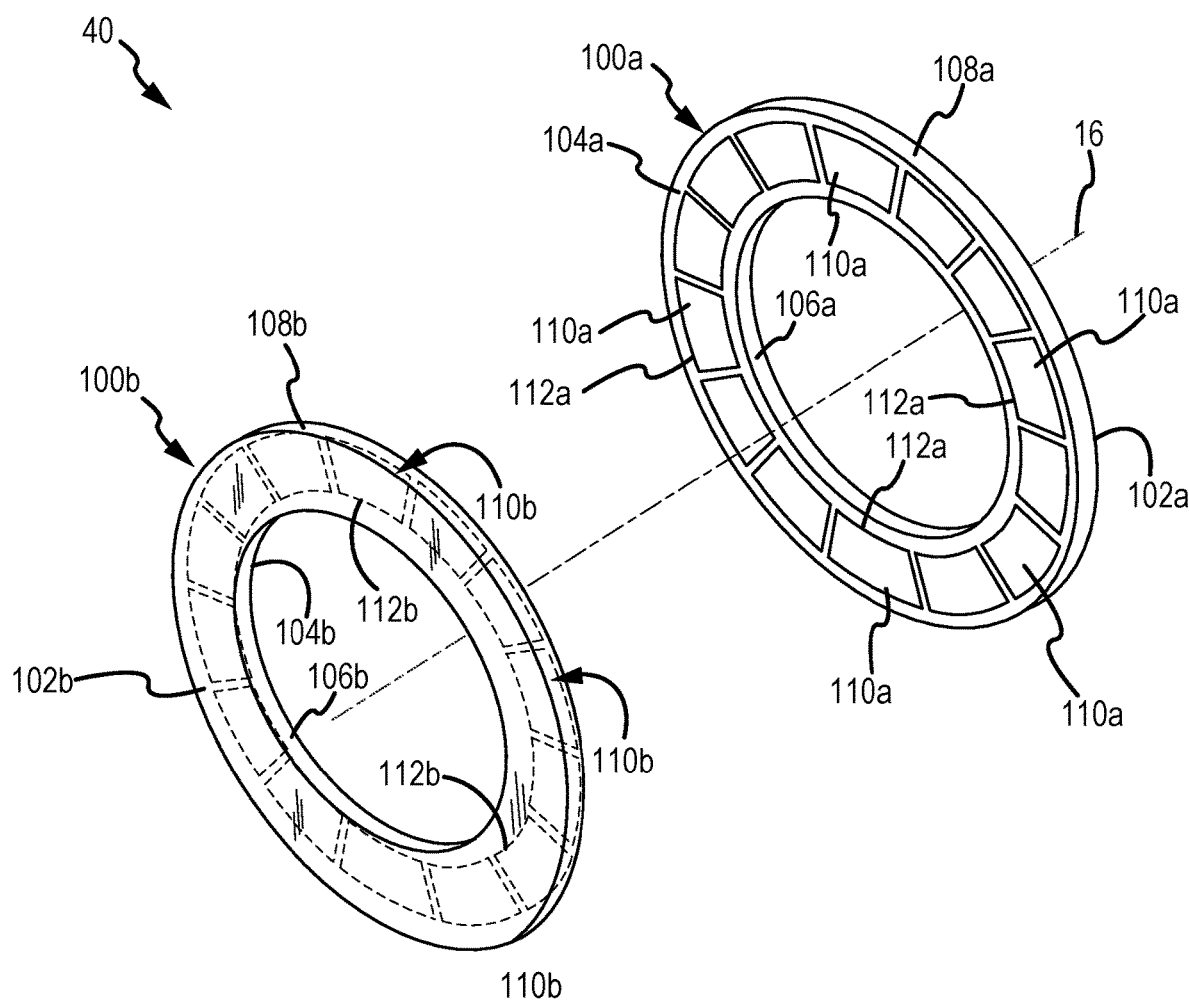
FIG. 2 illustrates an assembly view of a rotor disk comprised of friction disks that include ceramic inserts, in accordance with various embodiments.

With reference to FIG. 2, an assembly view of a stator disk 40 is illustrated. In FIG. 2, stator lugs 44 have been removed from stator disk 40 to more clearly illustrate components of the stator disk. In accordance with various embodiments, stator disk 40 may comprise a split disk. In this regard, stator disk 40 may be formed by coupling a first friction disk 100a to a second friction disk 100b. First friction disk 100a includes a wear surface 102a and a non-wear surface 104a. Wear surface 102a and non-wear surface 104a may each extend from an inner diameter surface 106a to an outer diameter surface 108a of first friction disk 100a. Inner diameter surface 106a is oriented radially inward (i.e., toward axis 16) and outer diameter surface 108a is oriented radially outward (i.e., away from axis 16).

Second friction disk 100b includes a wear surface 102b and a non-wear surface 104b. Wear surface 102a is oriented away from wear surface 102b. Non-wear surface 104a is oriented toward and/or may contact non-wear surface 104b, when stator disk 40 is assembled. Wear surface 102b and non-wear surface 104b may each extend from an inner diameter surface 106b, to an outer diameter surface 108b of second friction disk 100b. Inner diameter surface 106b is oriented radially inward (i.e., toward axis 16) and outer diameter surface 108b is oriented radially outward (i.e., away from axis 16).

In accordance with various embodiments, one or more ceramic inserts may be located in the non-wear surfaces 104a, 104b of friction disks 100a, 100b. For example, ceramic inserts 110a may be located in recesses 112a defined by non-wear surface 104a, and ceramic inserts 110b may be located in recesses 112b defined by non-wear surface 104b.

Recesses 112a may extend axially from non-wear surface 104a toward wear surface 102a and may be formed partially through first friction disk 100a, such that an axial thickness of first friction disk 100a is greater than an axial depth of recesses 112a. In this regard, a portion of the C/CMC composite material of friction disk 100a is located axially between the floor of recesses 112a and wear surface 102a. Recesses 112b may extend axially from non-wear surface 104b toward wear surface 102b and may be formed partially through second friction disk 100b, such that an axial thickness of second friction disk 100b is greater than an axial depth of recesses 112b. In this regard, a portion of the C/CMC composite material of second friction disk 100b is located axially between the floor of recesses 112b and wear surface 102b. In various embodiments, the axial depth of recesses 112a, 112b is selected such that, after a full wear cycle of the stator disk 40, ceramic inserts 110a, 110b remain unexposed at wear surfaces 102a, 102b, respectively. Stated differently, in response to at least one of first friction disk 100a or second friction disk 100b being worn to a fully worn state, wherein stator disk 40 is no longer suitable for use in the brake assembly, a portion of the C/CMC composite material remains between ceramic inserts 110a, 110b and wear surfaces 102a, 102b, respectively.

Ceramic inserts 110a are spaced apart radially from inner diameter surface 106a and outer diameter surface 108a. In this regard, a radial height of each of the ceramic inserts 110a and the recesses 112a is less than a radial distance measured from inner diameter surface 106a to outer diameter surface 108a. Ceramic inserts 110b are spaced apart radially from inner diameter surface 106b and outer diameter surface 108b. In this regard, a radial height of the ceramic inserts 110b and the recesses 112b is less than a radial distance measured from inner diameter surface 106b to outer diameter surface 108b.

Ceramic inserts 110a, 110b, may be fabricated by depositing a ceramic material in the form of ceramic powder into the recesses 112a, 112b, respectively, and depositing a matrix material (e.g. carbon matrix) via chemical vapor infiltration (CVI) over and around the ceramic powder to secure the ceramic powder within the friction disk. In various embodiments, recesses 112a, 112b are formed after the C/CMC composite material of the friction disk is densified via CVI (i.e., after deposition of ceramic matrix about the carbon fibers). In various embodiments, recesses 112a, 112b are formed prior to densification. In various embodiments, friction disks 100a, 100b may be formed from C/C composite material with recesses 112a, 112b being formed after the C/C composite material of the friction disk is densified via CVI (i.e., after deposition of carbon matrix about the carbon fibers). In various embodiments, friction disks 100a, 100b may be formed from C/C composite material with recesses 112a, 112b being formed before densification the C/C composite material of the friction disk is densified via CVI (i.e., before deposition of carbon matrix about the carbon fibers).

Suitable ceramic powders for deposition into recesses 112a, 112b, may include, for example, silicon carbide (SiC), boron (B), boron carbide ($B_4C$), silicon nitride ($Si_3N_4$), titanium diboride ($TiB_2$), or other similar oxides, borides or nitrides. A range of particle sizes (or powder sizes) may be employed in the ceramic powders used to fabricate the ceramic inserts. For example, in various embodiments, a micron-sized boron powder or micron-sized boron carbide powder may be selected. In various embodiments, the powder size may include a particle size distribution such as a bimodal particle distribution. In various embodiments, the powder size (or the powder size distribution) may be selected based on a desired grain size with smaller powder sizes yielding smaller grain sizes. For example, a nanoparticle-sized powder is typically found to yield a smaller grain size than a micrometer-sized powder. The grain size may also impact the thermal properties of the finished component. In various embodiments, uniformity of the dimensions or size of individual particles of the powder (e.g., a particle uniformity) may vary. For example, the particle uniformity may vary in characteristic dimension (e.g., diameter) by as much as +/−80%. In various embodiments, the particle size or uniformity may also vary according to a Gaussian distribution or by other industrially accepted variances.

In various embodiments, the ceramic powder may comprise an average particle diameter between 50 microns and 1500 microns (0.002 inches to 0.059 inches). In various embodiments, the ceramic powder may comprise an average particle diameter between 100 microns and 1000 microns (0.004 inches to 0.039 inches).

In various embodiments, ceramic inserts 110a, 110b may be formed by depositing a mixture of chopped carbon fibers and ceramic powder into recesses 112a, 112b, respectively, and depositing a matrix material (e.g. carbon matrix) via CVI over and around the chopped carbon fibers and ceramic powder to secure the chopped carbon fibers and ceramic powder within the friction disk. In various embodiments, the ceramic powder may comprise boron carbide. In various embodiments, the chopped fibers within the mixture comprise one or more fiber materials, such as, for example, carbon fibers, silicon carbide fibers, boron fibers, or other similar types of fibers. A fiber filament diameter (or a characteristic cross sectional dimension) has an average value equal to about five micrometers (5 μm) (≈0.0002 in), about 10 μm (≈0.0004 in), about 20 μm (≈0.0008 in), about 50 μm (≈0.002 in) or about 100 μm (≈0.004 in). In this regard, the fiber filament diameter may range from about 7 μm (≈0.0003 in) to about 15 μm (≈0.0006 in), or from about 5 μm (≈0.0002 in) to about 50 μm (≈0.002 in), or from about 3 μm (≈0.0001 in) to about 100 μm (≈0.004 in). Similarly, an average fiber filament length for the chopped fibers may have a value ranging from about one millimeter (1 mm) (≈0.035 in) to about 254 mm (≈10.0 in), or from about 2 mm (≈0.07 in) to about 100 mm (≈4.0 in), or from about 3.2 mm (≈0.125 in) to about 50 mm (≈2.0 in). In various embodiments, the average fiber filament length (or a mean fiber filament length) may scale with a characteristic dimension of the recesses and may have, for example, a value up to or equal to the radial height of the recess.

While FIG. 2 describes a stator disks 40 including ceramic inserts, it is contemplated and understood that, in various embodiments, rotor disks 42, with momentary reference to FIG. 1, may include a pair of split disks (i.e., friction disks coupled together) having ceramic inserts located in recesses formed in the non-wear surface of the friction disks, similar to ceramic inserts 110a, 110b. Additionally, while ceramic inserts 110a, 110b and recesses 112a, 112b are illustrated as having an arcuate shape, it is contemplated and understood that other shapes, such as circular, oval, rectangular, polygonal, or any other desired shape, are possible.

Figure 3A:
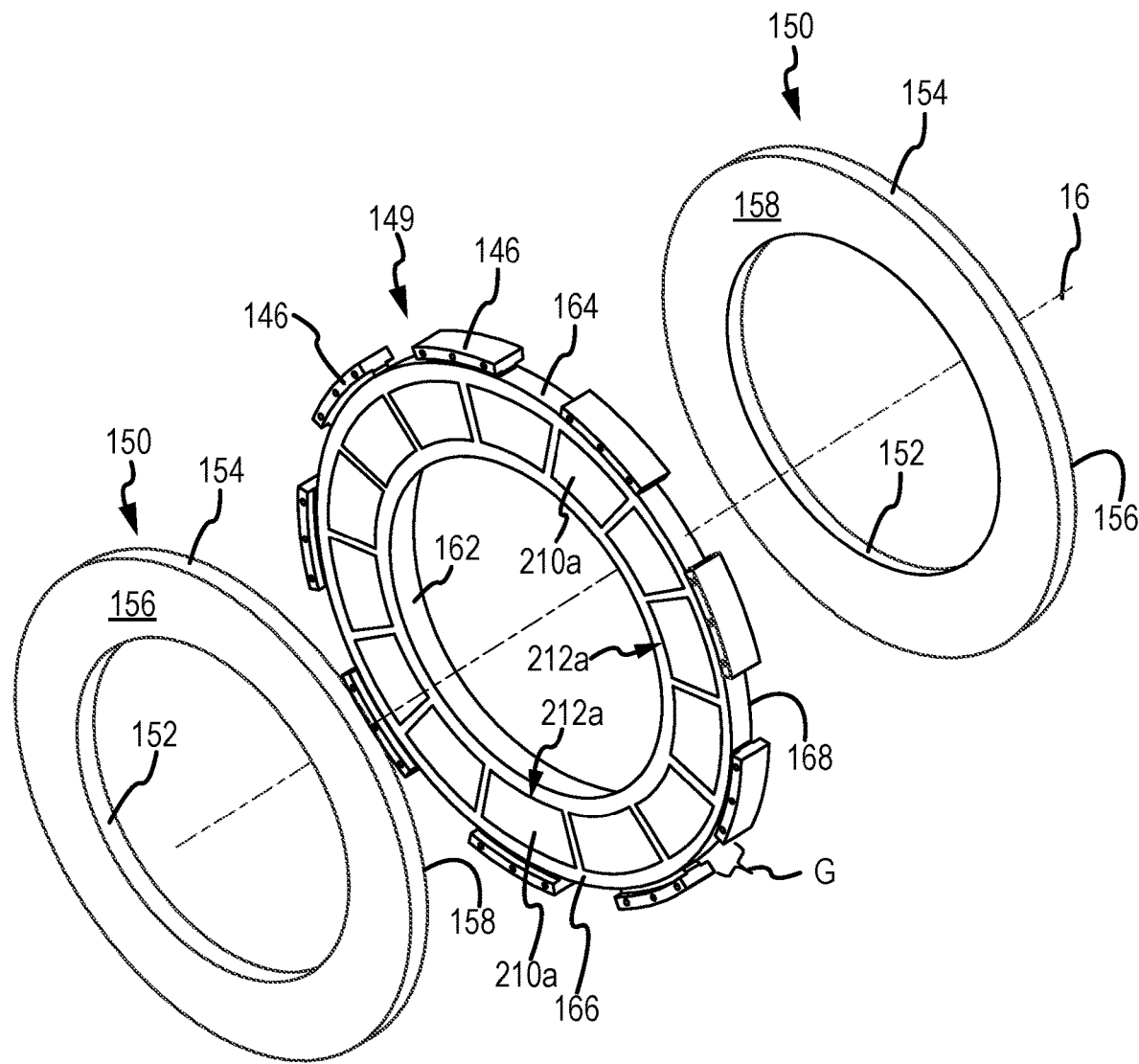
FIG. 3A illustrates an assembly view of a rotor disk comprised of wear liners attachable to friction disk core having ceramic inserts located therein, in accordance with various embodiments.
Figure 3B:
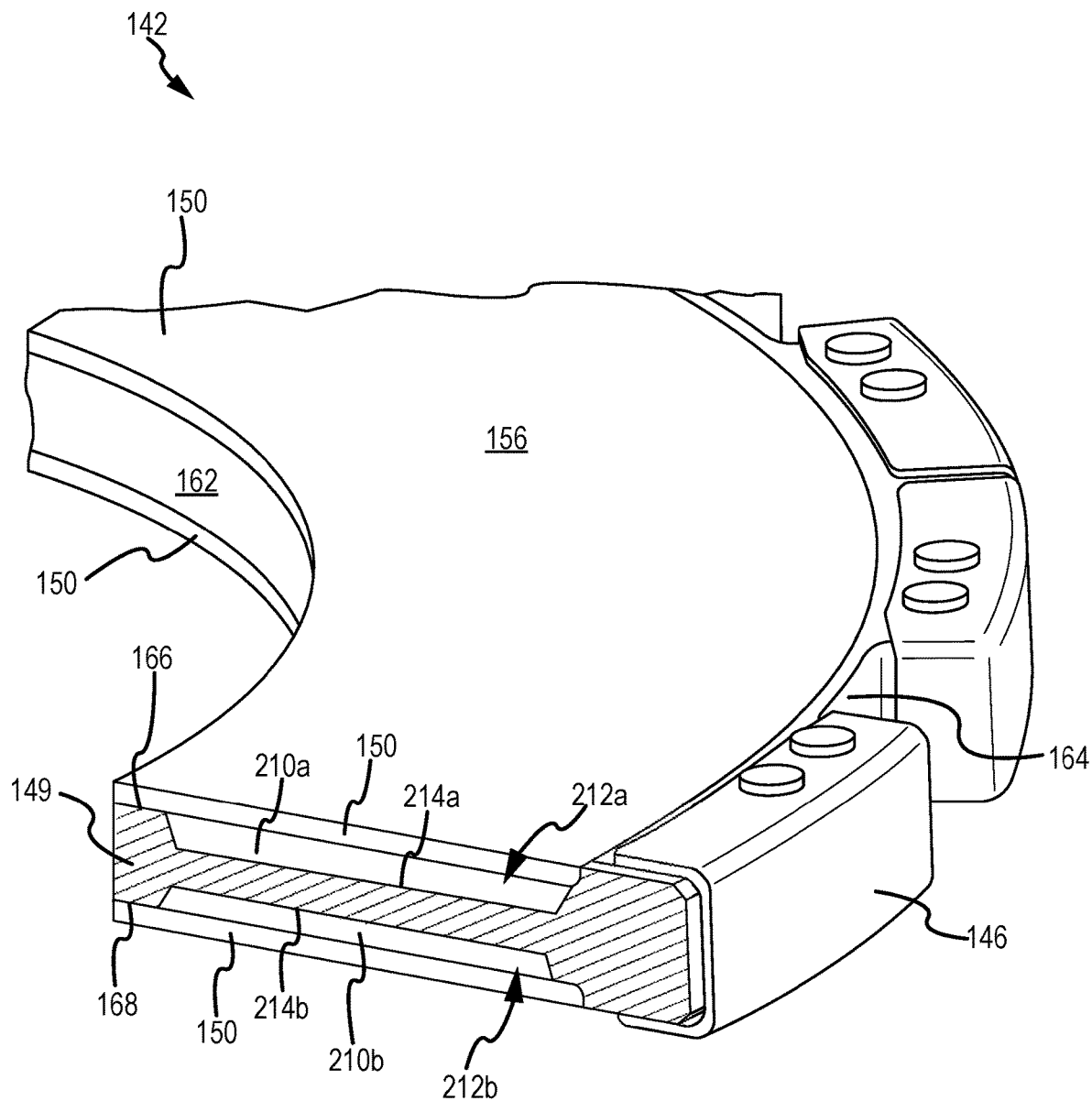
FIG. 3B illustrates a cross-section view of the assembled rotor of FIG. 3A, in accordance with various embodiments.

With reference to FIGS. 3A and 3B, an assembly view of a rotor disk 142 and a cross-section view of assembled rotor disk 142 are illustrated, respectively. In various embodiments, brake assembly 20, with momentary reference FIG. 1, may include rotor disk 142 in place of one or more rotor disks 42. Rotor disk 142 includes a rotor core 149 (also referred to as a friction disk core) and one or more wear liners 150 coupled to rotor core 149. In various embodiments, rotor core 149 and wear liners 150 may comprise different materials. For example, in various embodiments, rotor core 149 may comprise a first material such as C/CMC composite material, and wear liners 150 may comprise a second material such as a C/C composite material. However, in various embodiments, rotor core 149 and wear liners 150 may comprise the same material, such as C/C composite material. In various embodiments, the material of rotor core 149 may be selected for its structural properties, thermal conductivity, heat capacity, and/or oxidation resistance properties. In various embodiments, a material of wear liners 150 may be selected for its wear resistance and/or frictional properties. Thus, rotor disk 142 may contain the structural advantages of rotor core 149 and the frictional advantages of wear liners 150.

Wear liners 150 may comprise an inner diameter surface 152 and an outer diameter surface 154. Wear liners 150 may further include a wear surface 156 and a non-wear surface 158 axially opposite wear surface 156. Wear surface 156 may extend from inner diameter surface 152 to outer diameter surface 154. Non-wear surface 158 may extend from inner diameter surface 152 to outer diameter surface 154 and may be oriented toward rotor core 149.

Rotor core 149 may comprise rotor lugs 146. Rotor core 149 may engage rotor splines 18 (FIG. 1) via gaps G formed between rotor lugs 146. Thus, rotor disk 142 may be rotatable by virtue of the engagement between rotor lugs 146 of rotor core 149 and rotor splines 18 of wheel 10 (FIG. 1). Rotor core 149 may comprise an inner diameter surface 162 and an outer diameter surface 164. Rotor lugs 146 may be extend radially outward from outer diameter surface 164. Rotor core 149 further comprises a first surface 166 and a second surface 168 axially opposite first surface 166. First surface 166 and second surface 168 extend from inner diameter surface 162 to and outer diameter surface 164.

In accordance with various embodiments, one or more ceramic inserts may be located in the first and second surface 166, 168 of rotor core 149. For example, and with reference to FIG. 3B, ceramic inserts 210a may be located in recesses 212a defined by first surface 166 of rotor core 149, and ceramic inserts 210b may be located in recesses 212b defined by second surface 168 of rotor core 149. Recesses 212a may extend axially from first surface 166 toward second surface 168, and recesses 212b may extend axially from second surface 168 toward first surface 166. Recesses 212a, 212b may be formed partially through rotor core 149, such that a portion of the C/CMC composite material (or C/C composite material) of rotor core 149 is located axially between the floor 214a of recesses 212a and the floor 214b of axially adjacent recesses 212b respectively. In various embodiments, recesses 212a may be circumferentially offset from recesses 212b. In various embodiments, recesses 212a that are circumferentially offset from recesses 212b may have greater axial thickness (e.g., the axial thickness of the recesses may be greater that 50% of the axial thickness of rotor core 149, as measured between first surface 166 and second surface 168). In various embodiments, one or more recesses 212a and/or one or more recesses 212b may extend completely through rotor core 149 (i.e., from first surface 166 to second surface 168).

Ceramic inserts 210a, 210b may be fabricated by depositing a ceramic material in the form of ceramic powder into the recesses 212a, 212b, respectively, and depositing a matrix material (e.g. carbon matrix) via CVI over and around the ceramic powder to secure the ceramic powder within the friction disk core. In various embodiments, recesses 212a, 212b are formed and the ceramic powder is deposited after the C/CMC composite material of the rotor core 149 is densified via CVI (i.e., after deposition of ceramic matrix about the carbon fibers). In various embodiments, recesses 212a, 212b are formed and the ceramic powder is deposited before the C/CMC composite material of the rotor core 149 is densified via CVI (i.e., prior to deposition of ceramic matrix about the carbon fibers). In various embodiments, rotor core 149 may be formed from C/C composite material, with recesses 212a, 212b being formed and the ceramic powder being deposited after the C/C composite material of the rotor core 149 is densified via CVI (i.e., after deposition of carbon matrix about the carbon fibers). In various embodiments, rotor core 149 may be formed from C/C composite material, with recesses 212a, 212b being formed and the ceramic powder being deposited before the C/C composite material of the rotor core 149 is densified via CVI (i.e., prior to deposition of carbon matrix about the carbon fibers).

Suitable ceramic powders for deposition into recesses 212a, 212b may include, for example, SiC, B, $B_4C$, $Si_3N_4$, $TiB_2$, or other similar oxides, borides or nitrides. In various embodiments, ceramic inserts 210a, 210b may be formed by depositing a mixture of chopped carbon fibers and ceramic powder into recesses 212a, 212b, respectively, and depositing a matrix material (e.g. carbon matrix) via CVI over and around the chopped fibers and ceramic powder to secure the chopped fibers and ceramic powder within the friction disk core. In various embodiments, the ceramic powder may comprise boron carbide. In various embodiments, the chopped fibers within the mixture comprise one or more fiber materials, such as, for example, carbon fibers, silicon carbide fibers, boron fibers, or other similar types of fibers.

While FIGS. 3A and 3B describe a rotor disk 142 including friction disk core 149 and wear liners 150, it is contemplated and understood that, in various embodiments, stator disks 40, with momentary reference to FIG. 1, may include a stator disk core having ceramic inserts located in recesses defined by the stator disk core with one or more wear liner coupled to the stator core, similar to rotor disk 142.

Figure 4:
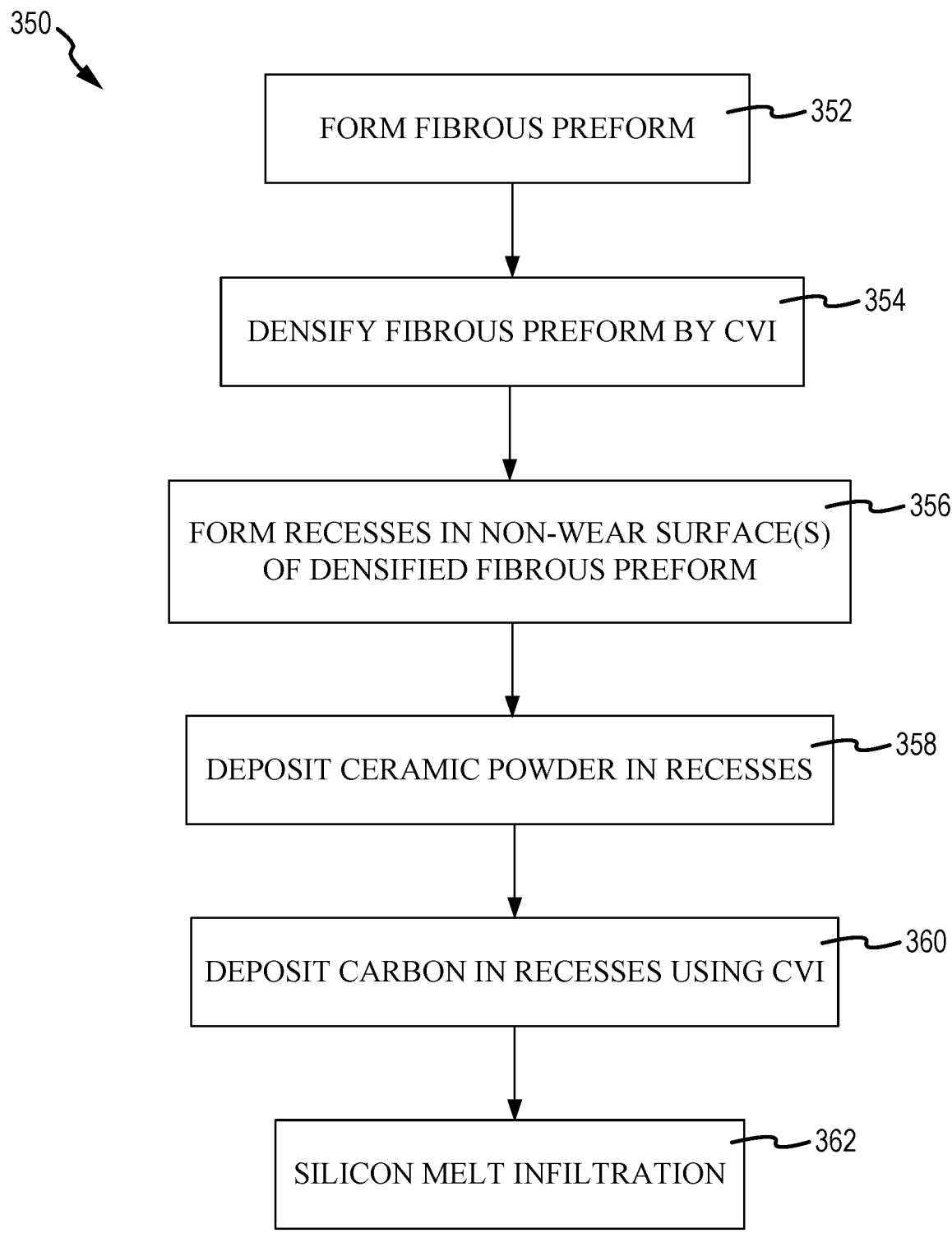
FIG. 4 illustrates a method of making a friction disk having ceramic inserts located therein, in accordance with various embodiments.

With reference to FIG. 4, a method 350 of fabricating a fiber reinforced composite part for a brake disk, a heat sink, or other friction disk component is illustrated. In accordance with various embodiments, one or more of friction disks 100a, 100b in FIG. 2 or friction disk core 149 in FIGS. 3A and 3B may be formed by method 350. In various embodiments, method 350 may comprise forming a fibrous preform (step 352). The fibrous preform may comprise a porous structure comprised of a plurality of textile layers. A porous structure may comprise any structure derived from a fibrous material such as carbon fibers or the like. In various embodiments, the carbon fibers may be derived from polyacrylonitrile (PAN), rayon (synthetic fiber derived from cellulose), oxidized polyacrylonitrile fiber (OPF), pitch, or the like. The starting fiber may be pre-oxidized PAN or fully carbonized commercial carbon fiber.

In various embodiments, step 352 may comprise carbonizing the fibrous preform. The carbonization process may be employed to convert the fibers of the fibrous preforms into pure carbon fibers, as used herein only "pure carbon fibers" means carbon fibers comprised of at least 99% carbon. The carbonization process is distinguished from the densification process described below in that the densification process involves infiltrating the pores of the fibrous preform and depositing a matrix (e.g., a carbon matrix) within and around the carbon fibers of the fibrous preform, and the carbonization process refer to the process of converting the fibers of the fibrous preform into pure carbon fibers. In various embodiments, step 352 may include fabricating the fibrous preform to have a fiber volume of 25% or greater. As used herein, "fiber volume" means the volume of the fibers of the fibrous preform relative to the total volume of the fibrous preform. For example, a fiber volume of 25% means the volume of the fibers in the fibrous preform is 25% of the total volume of fibrous preform. In various embodiments, after carbonization, the fibrous preform may comprise a fiber volume of between 23% and 50%. In various embodiments, after carbonization, the fibrous preform comprises a fiber volume of between 25% and 40%.

Method 350 further comprises densifying the fibrous preform (step 354). Step 354 may include densifying the fibrous preform by CVI to form a densified fibrous preform. In this regard, in step 354, the fibrous preform is densified with an additional material, such as, for example, carbon, using CVI to form a densified fibrous preform. Step 354 may form a carbon matrix around the fibers of the fibrous preform. In various embodiments, step 354 may form a ceramic matrix (e.g., a matrix including carbon and ceramic) around the fibers of the fibrous preform.

Method 350 further comprises forming recesses in one or more non-wear surfaces of the densified preform (step 356). In various embodiments, step 356 may include forming the recesses by machining or drilling. Method 350 further comprises depositing ceramic powder in the recesses (step 358). In various embodiments, step 358 may include depositing $B_4C$ powder into the recesses. In various embodiments, step 358 may include depositing $B_4C$ powder and chopped carbon fibers into the recesses. The $B_4C$ powder may comprise an average particle diameter from 50 microns to 1500 microns (0.002 inches to 0.059 inches), or in various embodiments 100 microns to about 1000 microns (0.004 inches to 0.039 inches).

In various embodiments, after depositing the ceramic powder into the recesses (i.e., after step 358), an additional material, such as, for example, carbon, may be deposited into the recesses using CVI (step 360). During step 360, carbon may infiltrate and bond to the material within the recesses (e.g., to the ceramic powder or the ceramic powder and chopped fibers), thereby securing the ceramic powder or the ceramic powder and chopped fibers in the recesses. In various embodiments, a silicon melt infiltration (SMI) (step 362) may be performed after step 360 to fill any remaining porosity within the ceramic powder and/or between the ceramic powder and the chopped fibers within the recesses.

In various embodiments, step 356 may include forming a plurality of first recesses in a first surface of the densified fibrous preform and forming a plurality of second recesses in a second surface of the densified fibrous preform. In various embodiments, step 358 and step 360, may be performed to form ceramic inserts in the first recesses, and then step 358 and step 360 may be repeated to form ceramic inserts in the second recesses. Stated differently, after securing the ceramic powder in the first recesses, ceramic powder (or ceramic powder and chopped fibers) may be deposited into the second recesses. The ceramic powder may be secured in the second recesses by depositing carbon around the ceramic powder using CVI. In various embodiments a first SMI (step 362) is performed after depositing the carbon into the first recessed, but prior to depositing the ceramic powder into the second recesses, and a second SMI (step 362) is performed after depositing carbon into the second recesses. In various embodiments, the SMI (step 362) is performed only after depositing carbon into the second recesses (i.e., a SMI is performed).

Figure 5:
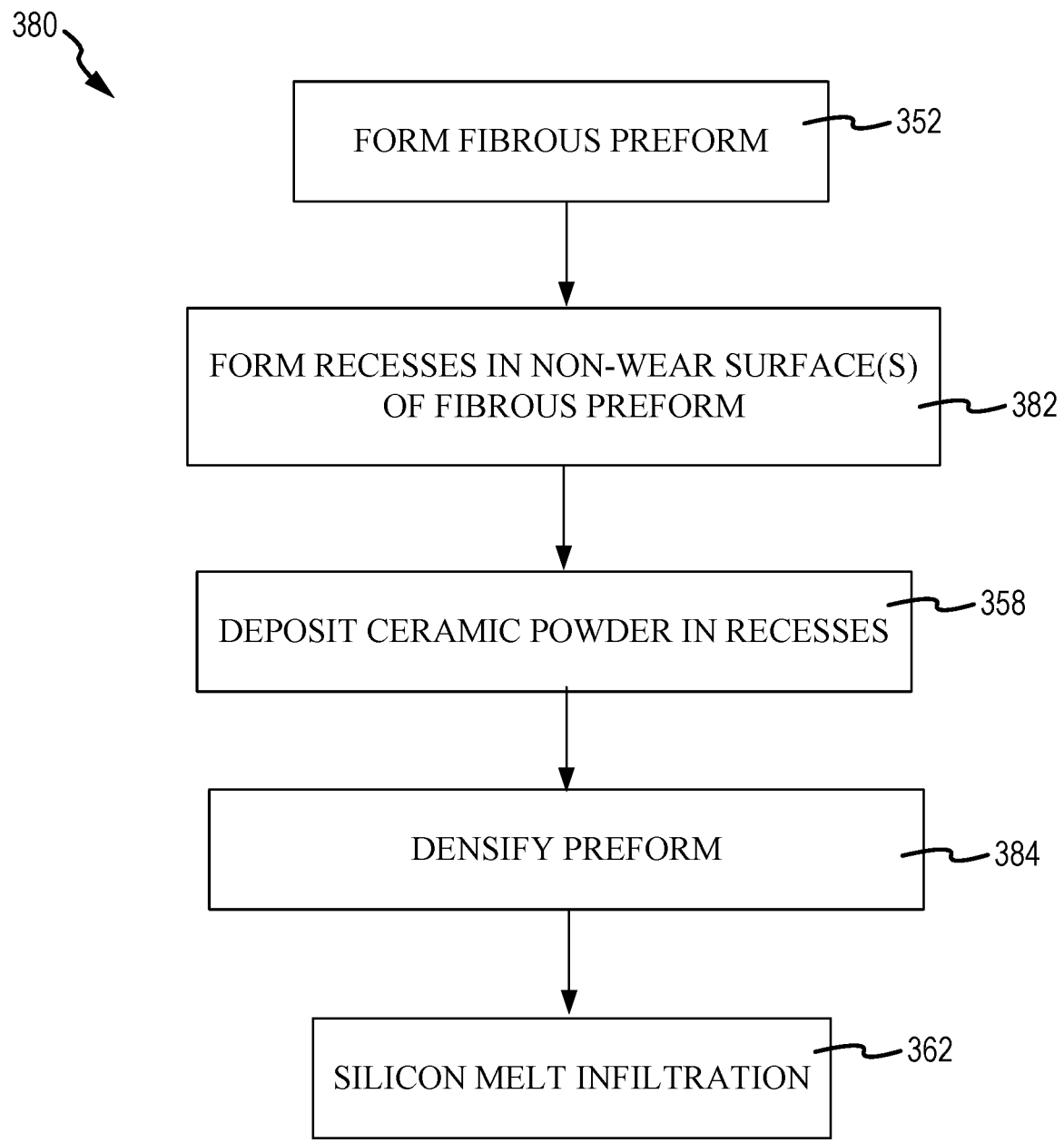
FIG. 5 illustrates a method of making a friction disk having ceramic inserts located therein, in accordance with various embodiments.

With reference to FIG. 5, a method 380 of fabricating a fiber reinforced composite part for a brake disk, a heat sink, or other friction disk component is illustrated. In accordance with various embodiments, one or more of friction disks 100a, 100b in FIG. 2 or friction disk core 149 in FIGS. 3A and 3B may be formed by method 380. In addition to steps 352, 358, and 362 from method 350 in FIG. 4, method 380 may comprise forming recesses in one or more non-wear surfaces of the fibrous preform (step 382). In various embodiments, step 382 may include forming the recesses by machining or drilling. In various embodiments, step 382 may including molding or pressing the fibrous preform to form the recesses. In accordance with various embodiments, step 382 may be performed prior to densification of the fibrous preform.

Method 380 further comprises depositing ceramic powder in the recesses (step 358, as described above with reference to method 350). Method 380 further comprises densifying the preform (step 384). Step 384 may be performed using CVI. Step 384 may be performed after depositing the ceramic powder. In this regard, step 384 may form a carbon matrix or carbon/ceramic matrix around the fibers of the fibrous preform and around the ceramic powder, thereby securing the ceramic powder within the recesses.

In various embodiments, step 382 may include forming a plurality of first recesses in a first surface of the fibrous preform and forming a plurality of second recesses in a second surface of the fibrous preform. In various, step 358 and step 384 may be performed to form ceramic inserts in the first recesses, and then step 358 and step 384 may be repeated to form ceramic inserts in the second recesses. Stated differently, after securing the ceramic powder in the first recesses, ceramic powder (or ceramic powder and chopped fibers) may be deposited into the second recesses. The ceramic powder may be secured in the second recesses by depositing carbon around the ceramic powder using CVI.

Figure 6:
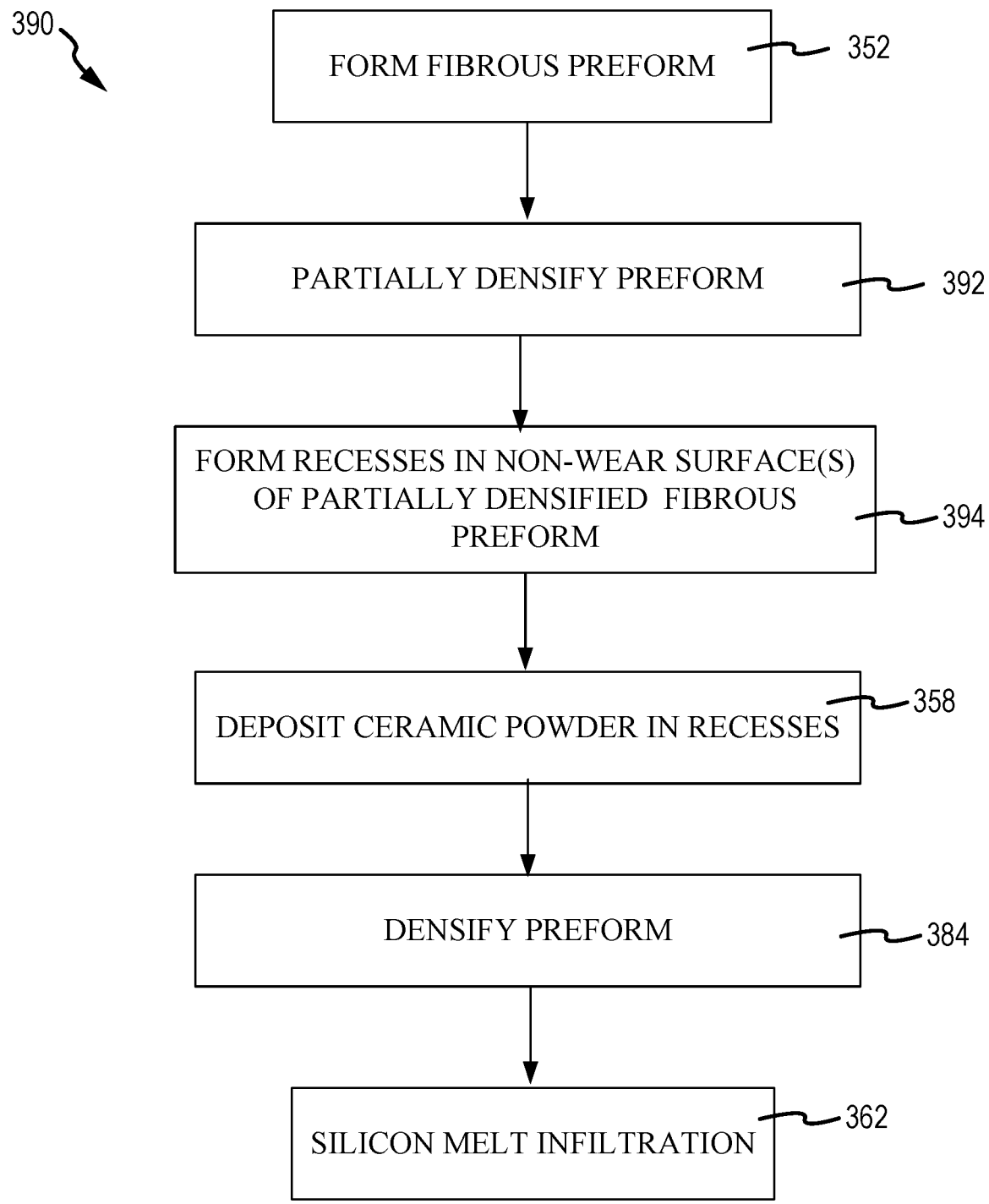
FIG. 6 illustrates a method of making a friction disk having ceramic inserts located therein, in accordance with various embodiments.

With reference to FIG. 6, a method 390 of fabricating a fiber reinforced composite part for a brake disk, a heat sink, or other friction disk component is illustrated. In accordance with various embodiments, one or more of friction disks 100a, 100b in FIG. 2 or friction disk core 149 in FIGS. 3A and 3B may be formed by method 390. In addition to steps 352, 358, and 362 from method 350 in FIG. 4 and step 384 from method 380 in FIG. 5, method 390 may comprise partially densifying the fibrous preform (step 392). Step 392 may include partially densifying the fibrous preform by CVI to form a partially densified fibrous preform. Step 392 may form a carbon matrix around the fibers of the fibrous preform. In various embodiments, step 394 may form a ceramic matrix (e.g., a matrix including carbon and ceramic) around the fibers of the fibrous preform.

Method 390 further comprising forming recesses in one or more non-wear surfaces of the partially densified fibrous preform (step 394). In various embodiments, step 394 may include forming the recesses by machining or drilling. Method 390 further comprises depositing ceramic powder in the recesses (step 358, as described above with reference to method 350 in FIG. 4). Method 390 further comprises densifying the preform (step 384, as described above with reference to method 380 in FIG. 5). In various embodiments, step 394 may include forming a plurality of first recesses in a first surface of the partially densified fibrous preform and forming a plurality of second recesses in a second surface of the partially densified fibrous preform. In various, step 358 and step 384 may be performed to form ceramic inserts in the first recesses, and then step 358 and step 384 may be repeated to form ceramic inserts in the second recesses. Stated differently, after securing the ceramic powder in the first recesses, ceramic powder (or ceramic powder and chopped fibers) may be deposited into the second recesses. The ceramic powder may be secured in the second recesses by depositing carbon around the ceramic powder using CVI.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. All ranges and ratio limits disclosed herein may be combined.

Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

The steps recited in any of the method or process descriptions may be executed in any order and are not necessarily limited to the order presented. Furthermore, any reference to singular includes plural embodiments, and any reference to more than one component or step may include a singular embodiment or step. Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

Any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts or areas but not necessarily to denote the same or different materials. In some cases, reference coordinates may be specific to each figure.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A brake disk, comprising:
   a first friction disk formed of at least one of a carbon fiber-ceramic matrix composite material or a carbon fiber-carbon matrix composite material, wherein a first surface of the first friction disk defines a first recess, the first surface extending from an inner diameter to an outer diameter of the first friction disk;
   a first ceramic insert comprising ceramic powder located in the first recess; and
   a second ceramic insert located in a second recess of the first friction disk, wherein the second recess is defined by a second surface of the first friction disk, the second surface being oriented away from the first surface,
   wherein the first friction disk comprises at least one of a rotor core or a stator core.

2. The brake disk of claim 1, wherein the ceramic powder comprises boron carbide.

3. The brake disk of claim 1, wherein the first ceramic insert further comprises chopped fibers.

4. The brake disk of claim 1, further comprising a wear liner coupled to the first friction disk.

5. A method of making a friction disk, comprising:
   densifying a fibrous preform to form a densified fibrous preform;

forming a plurality of first recesses in a first surface of the densified fibrous preform;

depositing a ceramic powder in the plurality of first recesses; and depositing carbon around the ceramic powder in the plurality of first recesses using chemical vapor infiltration.

6. The method of claim 5, further comprising performing a silicon melt infiltration.

7. The method of claim 5, further comprising:

forming a plurality of second recesses in a second surface of the densified fibrous preform; and depositing ceramic powder in the plurality of second recesses.

8. The method of claim 5, wherein the densified fibrous preform comprises carbon fiber-carbon matrix composite material.

9. The method of claim 5, wherein the ceramic powder in the plurality of first recesses comprises boron carbide.

10. The method of claim 5, further comprising depositing chopped fibers in the plurality of first recesses.

11. A method of making a brake disk, comprising:

forming a first friction disk by:

forming a plurality of first recesses in a first surface of a first fibrous preform;

depositing a ceramic powder in the plurality of first recesses; and depositing carbon around the ceramic powder in the plurality of first recesses using chemical vapor infiltration.

12. The method of claim 11, further comprising coupling a first wear liner over the first surface of the first friction disk.

13. The method of claim 12, wherein forming the first friction disk further comprises:

forming a plurality of second recesses in a second surface of the first fibrous preform, the second surface being axially opposite the first surface;

depositing ceramic powder in the plurality of second recesses; and depositing carbon around the ceramic powder in the plurality of second recesses using chemical vapor infiltration.

14. The method of claim 11, further comprising depositing chopped fibers in the plurality of first recesses.

15. The method of claim 14, further comprising densifying the first fibrous preform prior to forming the plurality of first recesses.

16. The method of claim 11, further comprising:

forming a second friction disk by:

forming a plurality of second recesses in a non-wear surface of a second fibrous preform;

depositing ceramic powder in the plurality of second recesses; and depositing carbon around the ceramic powder in the plurality of second recesses using chemical vapor infiltration; and coupling the second friction disk to the first friction disk with the non-wear surface of the second friction disk oriented toward the first surface of the first friction disk.

* * * * *